United States Patent
Jia et al.

(10) Patent No.: US 9,277,686 B2
(45) Date of Patent: Mar. 1, 2016

(54) CLAMPING DEVICE

(71) Applicants: FU DING ELECTRONICAL TECHNOLOGY (JIASHAN) CO.,LTD., Zhejiang (CN); HON HAI PRECISION INDUSTRY CO., LTD., New Taipei (TW)

(72) Inventors: Jian-Shi Jia, Jiashan (CN); Yang-Mao Peng, Jiashan (CN)

(73) Assignees: FU DING ELECTRONICAL TECHNOLOGY (JIASHAN) CO.,LTD., Zhejiang (CN); HON HAI PRECISION INDUSTRY CO., LTD., New Taipei (TW)

( * ) Notice: Subject to any disclaimer, the term of this patent is extended or adjusted under 35 U.S.C. 154(b) by 170 days.

(21) Appl. No.: 14/103,783

(22) Filed: Dec. 11, 2013

(65) Prior Publication Data

US 2014/0167341 A1   Jun. 19, 2014

(30) Foreign Application Priority Data

Dec. 17, 2012   (CN) ...................... 2012 2 0697775 U

(51) Int. Cl.
  *B23Q 1/25*   (2006.01)
  *H05K 13/04*   (2006.01)
  *B25B 1/10*   (2006.01)
  (Continued)

(52) U.S. Cl.
  CPC ............ *H05K 13/0404* (2013.01); *B25B 1/106* (2013.01); *B25J 17/0225* (2013.01); *B25B 1/18* (2013.01); *B25B 5/061* (2013.01);
  (Continued)

(58) Field of Classification Search
  CPC .......... B25B 1/106; B25B 5/061; B25B 1/18; B25B 5/067; B25B 5/082; B25B 5/087; B25B 5/101
  USPC ............. 269/23, 24, 25, 2, 32, 34, 86, 26, 27, 269/35, 289 R, 254 R, 291; 901/31, 39, 16; 409/201
  See application file for complete search history.

(56) References Cited

U.S. PATENT DOCUMENTS 2,063,718 A * 12/1936 Berndt .......................... 439/788
2,696,855 A * 12/1954 Seegers ........................ 81/57.42

(Continued)

OTHER PUBLICATIONS

Childs, Peter R.N.. (2004). Mechanical Design (2nd Edition)—15.2 Component Tolerances. Elsevier.*

*Primary Examiner* — Monica Carter
*Assistant Examiner* — Mahdi H Nejad
(74) *Attorney, Agent, or Firm* — Novak Druce Connolly Bove + Quigg LLP

(57) ABSTRACT

A clamping device comprises a driving cylinder, a buffering assembly, a first clamping member, and a second clamping member. The first clamping member and the second clamping member are mounted to the driving cylinder. The buffering assembly comprises a fixing member, a guiding rail, a guiding rod, and an elastic member. The fixing member comprises a first mounting portion and a second mounting portion. The first mounting portion defines a through hole. The guiding rail is mounted to the fixing member and located between the first mounting portion and the second mounting portion. The driving cylinder is mounted to the guiding rail. A first end of the guiding rod is movably received through the through hole, and a second end of the guiding rod is fixed to the driving cylinder. Opposite ends of the elastic member resist against the first mounting portion and the driving cylinder, respectively.

13 Claims, 2 Drawing Sheets

(51) Int. Cl.
  *B25J 17/02* (2006.01)
  *B25B 1/18* (2006.01)
  *B25B 5/08* (2006.01)
  *B25B 5/06* (2006.01)
  *B25B 5/10* (2006.01)

(52) U.S. Cl.
  CPC ............... *B25B 5/067* (2013.01); *B25B 5/082* (2013.01); *B25B 5/087* (2013.01); *B25B 5/101* (2013.01)

(56) References Cited

U.S. PATENT DOCUMENTS

| | | | | |
|---|---|---|---|---|
| 4,215,262 A * | 7/1980 | Brastow | ............... | B23K 9/201 219/103 |
| 4,304,433 A * | 12/1981 | Langowski | ............ | E21B 19/14 294/106 |
| 4,393,579 A * | 7/1983 | Van Hooreweder | ............ | 29/740 |
| 4,473,249 A * | 9/1984 | Valentine et al. | ............ | 294/197 |
| 4,529,182 A * | 7/1985 | Valentine | ....................... | 269/34 |
| 4,637,775 A * | 1/1987 | Kato | ................... | B23Q 9/0064 294/86.4 |
| 7,657,996 B2 * | 2/2010 | Sano et al. | ..................... | 29/711 |
| 7,963,188 B2 * | 6/2011 | Takeda | ....................... | 74/490.01 |
| 8,061,748 B2 * | 11/2011 | Kipping et al. | ............... | 294/206 |
| 8,222,559 B2 * | 7/2012 | Chen et al. | ................. | 219/85.19 |
| 8,256,755 B2 * | 9/2012 | Hiromatsu | .................... | 269/238 |
| 8,491,251 B2 * | 7/2013 | Muraoka et al. | ............. | 414/739 |
| 8,496,426 B2 * | 7/2013 | Na et al. | ...................... | 414/749.1 |
| 8,500,385 B2 * | 8/2013 | Jin et al. | ........................ | 414/590 |
| 8,628,071 B2 * | 1/2014 | Fiedler et al. | .................... | 269/56 |
| 8,915,527 B2 * | 12/2014 | Watanabe | .................... | 294/99.1 |
| 8,960,656 B2 * | 2/2015 | Baumgarte et al. | ............ | 269/55 |
| 2002/0153735 A1 * | 10/2002 | Kress | ........................... | 294/87.1 |
| 2004/0151556 A1 * | 8/2004 | Ferrari | ............... | B23Q 17/2233 409/201 |
| 2007/0187880 A1 * | 8/2007 | Chiu | ............................. | 269/24 |
| 2008/0203637 A1 * | 8/2008 | Li | .......................... | B25B 1/103 269/71 |
| 2009/0278297 A1 * | 11/2009 | Wang et al. | .................... | 269/212 |
| 2010/0101356 A1 * | 4/2010 | Albin | ........................ | 74/490.03 |
| 2010/0119413 A1 * | 5/2010 | Rizzotte et al. | ................. | 422/63 |
| 2010/0178125 A1 * | 7/2010 | Tatsuda | ............... | B23Q 1/5406 409/183 |
| 2010/0187740 A1 * | 7/2010 | Orgeron | ....................... | 269/218 |
| 2010/0266358 A1 * | 10/2010 | Hiramoto | ........... | B23Q 11/0046 409/137 |
| 2011/0008144 A1 * | 1/2011 | Na | ..................... | G01R 31/2893 414/749.6 |
| 2011/0031671 A1 * | 2/2011 | Toncelli | ....................... | 269/100 |
| 2011/0127240 A1 * | 6/2011 | Chen | ..................... | B23K 3/027 219/85.19 |
| 2011/0193280 A1 * | 8/2011 | Yu | .................................. | 269/61 |
| 2012/0020753 A1 * | 1/2012 | Tullmann et al. | ...... | B23Q 1/012 409/168 |
| 2012/0034058 A1 * | 2/2012 | Jin | ......................... | B25J 9/041 414/591 |
| 2012/0134769 A1 * | 5/2012 | Friedman et al. | .......... | 414/751.1 |

* cited by examiner

CLAMPING DEVICE

BACKGROUND

1. Technical Field

The present disclosure relates to clamping devices, and particularly to a clamping device capable of compensating for a tolerance of a workpiece.

2. Description of Related Art

In automatic assembly of electronic components, a clamping device may clamp a first workpiece to be assembled to a second workpiece. However, a tolerance or a deformation of the first or second workpiece may lead to a deviation of clamping and assembling of the first workpiece to the second workpiece.

Therefore, there is room for improvement in the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
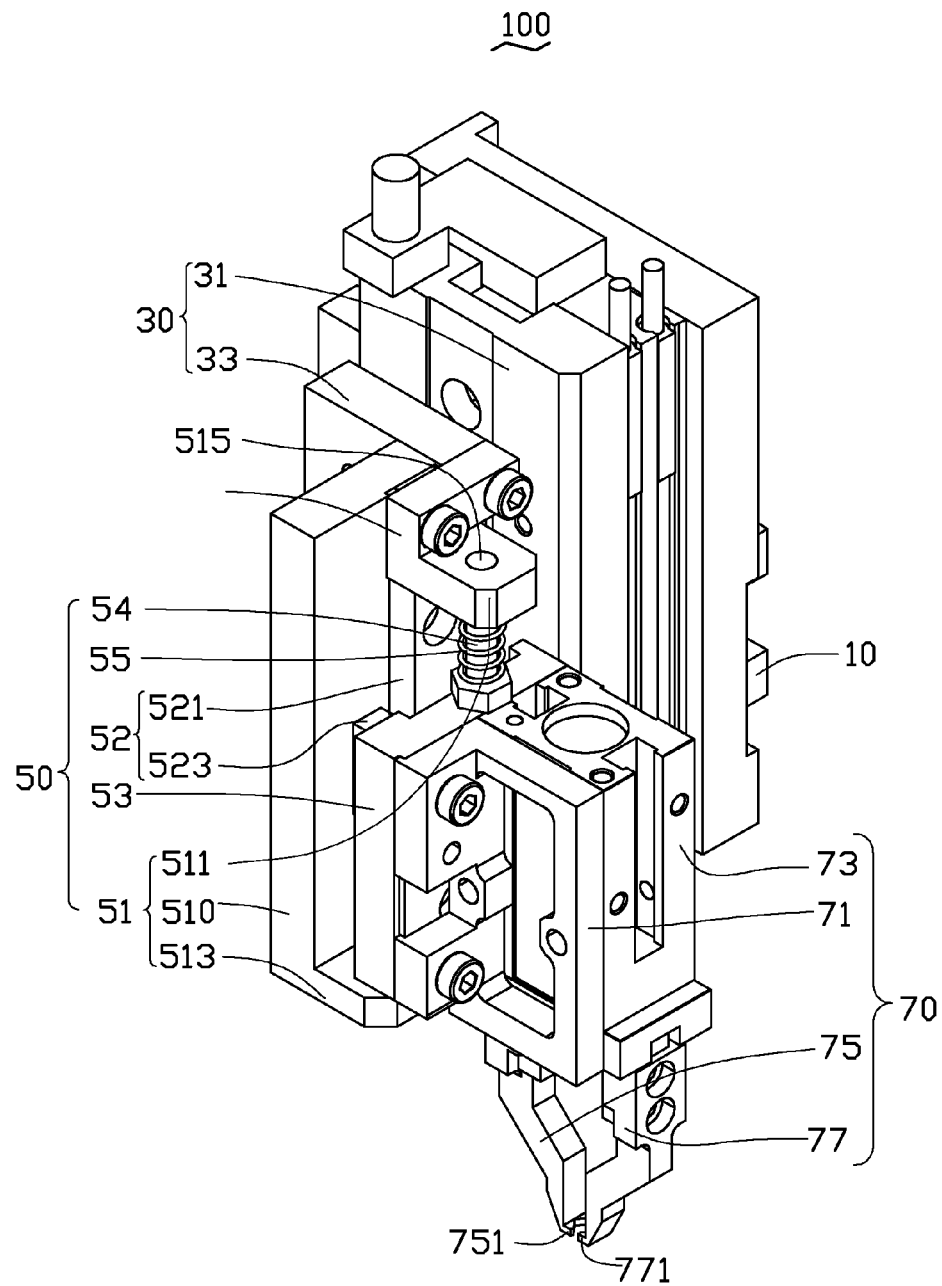
FIG. 1 is an isometric view of an embodiment of a clamping device.
Figure 2:
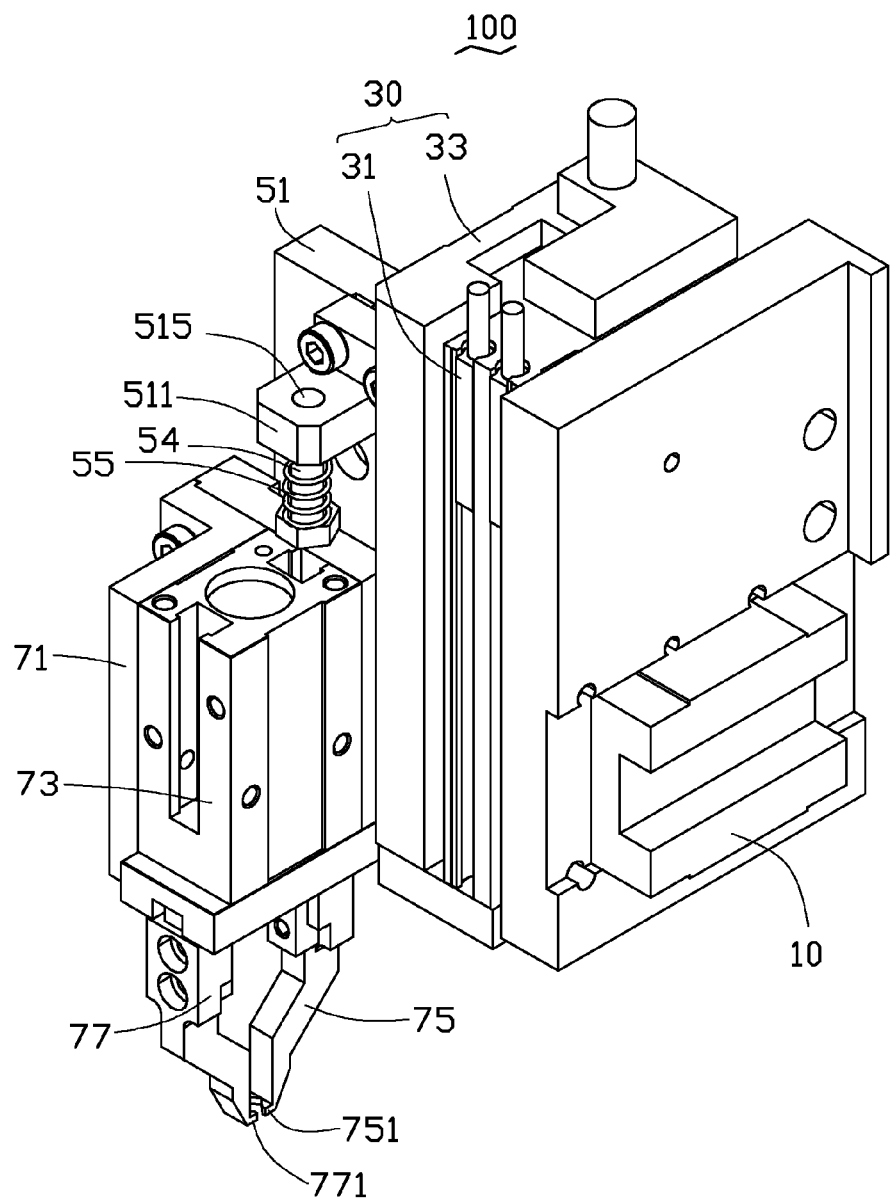
FIG. 2 is similar to FIG. 1, but viewed from another aspect.

FIGS. 1 through 2 show one embodiment of a clamping device 100 for clamping a workpiece (not shown) to attach or assemble to another workpiece (not shown). The clamping device 100 comprises a mounting member 10, a telescoping assembly 30, a buffering assembly 50, and a clamping assembly 70. The telescoping assembly 30, the buffering assembly 50, and the clamping assembly 70 are mounted to the mounting member 10. The clamping device 100 is configured to be assembled to a robot arm (not shown) or a platform (not shown) via the mounting member 10. The buffering assembly 50 and the clamping assembly 70 are attached to the telescoping assembly 30, thereby providing telescoping movement along with the telescoping assembly 30. The clamping assembly 70 is mounted to the buffering assembly 50 for clamping the workpiece.

The mounting member 10 is slidably connected to an outer guider (not shown) when in use, such that the clamping device 100 slides along a linear direction. The telescoping assembly 30 comprises a telescopic cylinder 31 and a telescoping block 33. The telescopic cylinder 31 is mounted to the mounting member 10. The telescoping block 33 is mounted to a side of the telescopic cylinder 31 away from the mounting member 10. The telescopic cylinder 31 is capable of moving the telescoping block 33 along a lengthwise direction thereof The buffering assembly 50 comprises a fixing member 51, a guiding rail 52, a connecting member 53, a guiding rod 54, and an elastic member 55. The fixing member 51 is fixed to the telescoping block 33, and comprises a main body 510, a first mounting portion 511, and a second mounting portion 513. The first mounting portion 511 is fixed to an upper end of the main body 510. The second mounting portion 513 extends substantially perpendicularly from a bottom end of the main body 510. The first mounting portion 511 defines a through hole 515 corresponding to the guiding rod 54.

The guiding rail 52 comprises a guiding portion 521 and a sliding portion 523 slidably engaged with the guiding portion 521. The guiding portion 521 is mounted to the main body 510 of the fixing member 51, such that opposite ends of the guiding portion 521 are fixed to the first mounting portion 511 and the second mounting portion 513, respectively. The sliding portion 523 is slidably sleeved on the guiding portion 521. The connecting member 53 is fixed to a sidewall of the sliding portion 523 away from the guiding portion 521. The connecting member 53 is located below the first mounting portion 511. An upper end of the guiding rod 54 is received through the through hole 515 of the first mounting portion 511, and a bottom end of the guiding rod 54 is fixed to the connecting member 53. A diameter of the guiding rod 54 is smaller than a diameter of the through hole 515. The elastic member 55 is sleeved around the guiding rod 54, such that opposite ends of the elastic member 55 resist against the first mounting portion 511 and the connecting member 53, respectively.

The clamping assembly 70 comprises a mounting block 71, a driving cylinder 73, a first clamping member 75, and a second clamping member 77. The driving cylinder 73 is fixed to the mounting block 71, and the mounting block 71 is fixed to the connecting member 53. Thus, the driving cylinder 73 is connected to the connecting member 53 via the mounting block 71. The first clamping member 75 and the second clamping member 77 are mounted to an end of the driving cylinder 73 away from the elastic member 55. A first clamping portion 751 and a second clamping portion 771 are formed at a distal end of the first clamping member 75 and a distal end of the second clamping member 77, respectively. The first clamping portion 751 and the second clamping portion 771 face each other. The driving cylinder 73 drives the first clamping portion 751 and the second clamping portion 771 to move towards or away from each other to clamp a workpiece.

In assembly, the mounting member 10 is connected to the telescopic cylinder 31. The telescoping block 33 is mounted to a sidewall of the telescopic cylinder 31 away from the mounting member 10. The fixing member 51 is mounted to the telescoping block 33, and the connecting member 53 is slidably mounted to the fixing member 51 via the guiding rail 52. The guiding rod 54 is movably received through the through hole 515 of the first mounting portion 511 and fixed to the connecting member 53, and the elastic member 55 is sleeved around the guiding rod 54. The driving cylinder 73 is fixed to the connecting member 53 via the mounting block 71, and the first clamping member 75 and the second clamping member 77 are connected to the distal end of the driving cylinder 73, respectively.

In use, the driving cylinder 73 first drives the first clamping member 75 and the second clamping member 77 to move away from each other. When a first workpiece (not shown) is located between the first clamping portion 751 and the second clamping portion 771, the driving cylinder 73 drives the first clamping member 75 and the second clamping member 77 to move towards each other to clamp the first workpiece. The telescopic cylinder 31 drives the first clamping member 75, the second clamping member 77, and the first workpiece being clamped by the first clamping portion 751 and the second clamping portion 771 to move to a second workpiece (not shown), thereby assembling the first workpiece to the second workpiece. If there is a tolerance variation or a deformation of the first workpiece or the second workpiece, the elastic member 55 is compressed to adjust a position of the first clamping portion 75 and the second clamping portion 77, thereby compensating for the tolerance or deformation variation amount. Therefore, clamping accuracy and assembling accuracy of the workpieces are improved.

In other embodiments, the connecting member 53 and the mounting block 71 can be omitted, such that the driving cylinder 73 is directly connected to the sliding portion 523, and an end of the guiding rod 54 away from the first mounting portion 511 is directly mounted to the driving cylinder 73. The telescoping block 33 may be omitted, such that the fixing member 51 is directly mounted to the telescopic cylinder 31. The telescoping assembly 30 can be omitted, such that the clamping device 100 is mounted to a robot arm when in use to achieve movement. The mounting member 10 can be omitted, such that the telescopic cylinder 31 is directly mounted to a robot arm or a platform when in use.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A clamping device, comprising:
 a driving cylinder;
 a buffering assembly comprising:
  a fixing member comprising a main body, a first mounting portion and a second mounting portion at opposite ends of the main body, the first mounting portion defining a through hole therein,
  a guiding rail mounted to the main body of the fixing member and located between the first mounting portion and the second mounting portion, the driving cylinder mounted to the guiding rail and located below the first mounting portion,
  a guiding rod, an end of the guiding rod movably inserted into the through hole of the first mounting portion, and an opposite end of the guiding rod fixed to the driving cylinder,
  an elastic member sleeved on the guiding rod, and opposite ends of the elastic member resisting against the first mounting portion and the driving cylinder, respectively;
 a first clamping member mounted to the driving cylinder;
 a second clamping member mounted to the driving cylinder, and opposite to the first clamping member;
 a telescoping assembly, wherein the telescoping assembly comprises a telescopic cylinder and a telescoping block mounted to the telescopic cylinder, the fixing member is mounted to the telescoping block, the telescoping block and the fixing member are movably-driven by the telescopic cylinder; and
 a mounting member, wherein the mounting member is mounted at a side of the telescopic cylinder away from the telescoping block.

2. The clamping device of claim 1, wherein the guiding rail comprises a guiding portion and a sliding portion slidably sleeved on the guiding portion, the guiding portion is mounted to the main body of the fixing member, and is located between the first mounting portion and the second mounting portion, the driving cylinder is mounted to the sliding portion.

3. The clamping device of claim 2, wherein the buffering assembly further comprises a connecting member mounted on the guiding rail, the driving cylinder is mounted to the connecting member, an end of the guiding rod away from the first mounting portion is fixed to the connecting member.

4. The clamping device of claim 3 further comprising a mounting block, wherein the mounting block is connected to the connecting member, the driving cylinder is mounted to the mounting block.

5. The clamping device of claim 1, wherein a first clamping portion is formed at an end of the first clamping member away from the driving cylinder, a second clamping portion is formed at an end of the second clamping member away from the driving cylinder, the first clamping portion and the second clamping portion are opposite to each other, the driving cylinder is capable of driving the first clamping portion and the second clamping portion to move towards or away from each other.

6. A clamping device, comprising:
 a clamping assembly comprising:
  a driving cylinder,
  a first clamping member mounted to the driving cylinder, and
  a second clamping member mounted to the driving cylinder, and opposite to the first clamping member;
 a telescoping assembly; and
 a buffering assembly comprising:
  a fixing member mounted to the telescoping assembly, and comprising a main body, a first mounting portion and a second mounting portion at opposite ends the main body, the first mounting portion defining a through hole therein;
  a guiding rail mounted to the main body of the fixing member, and located between the first mounting portion and the second mounting portion, the driving cylinder mounted to the guiding rail and located below the first mounting portion;
  a guiding rod, an end of the guiding rod movably inserted into the through hole of the first mounting portion, and an opposite end of the guiding rod fixed to the driving cylinder;
  an elastic member sleeved on the guiding rod; and
 a mounting member, wherein the mounting member is mounted to the telescoping assembly away from the fixing member for mounting the telescoping assembly.

7. The clamping device of claim 6, wherein the telescoping assembly comprises a telescopic cylinder and a telescoping block mounted to the telescopic cylinder, the fixing member is mounted to the telescoping block, the telescoping block and the fixing member are movably-driven by the telescopic cylinder.

8. The clamping device of claim 7, wherein the mounting member is mounted at a side of the telescopic cylinder away from the telescoping block.

9. The clamping device of claim 6, wherein the guiding rail comprises a guiding portion and a sliding portion slidably sleeved on the guiding portion, the guiding portion is mounted to the main body of the fixing member, and is located between the first mounting portion and the second mounting portion, the driving cylinder is mounted to the sliding portion.

10. The clamping device of claim 9, wherein the buffering assembly further comprises a connecting member mounted on the guiding rail, the driving cylinder is mounted to the connecting member, an end of the guiding rod away from the first mounting portion is fixed to the connecting member.

11. The clamping device of claim 10, wherein the clamping assembly further comprises a mounting block connected to the connecting member, the driving cylinder is mounted to the mounting block.

12. The clamping device of claim 6, wherein a first clamping portion is formed at an end of the first clamping member away from the driving cylinder, a second clamping portion is formed at an end of the second clamping member away from the driving cylinder, the first clamping portion and the second clamping portion are opposite to each other, the driving cylinder is capable of driving the first clamping portion and the second clamping portion to move towards or away from each other.

13. The clamping device of claim 6, wherein a diameter of the guiding rod is smaller than a diameter of the through hole.

\* \* \* \* \*